United States Patent [19]

Hirae et al.

[11] Patent Number: 5,554,939
[45] Date of Patent: Sep. 10, 1996

[54] NON-DESTRUCTIVE MEASURING SENSOR FOR SEMICONDUCTOR WAFER AND METHOD OF MANUFACTURING THE SAME

[75] Inventors: Sadao Hirae; Hideaki Matsubara; Motohiro Kouno; Takamasa Sakai, all of Kyoto, Japan

[73] Assignee: Dainippon Screen Manufacturing Co., Ltd., Japan

[21] Appl. No.: 171,026

[22] Filed: Dec. 21, 1993

[30] Foreign Application Priority Data

Dec. 22, 1992 [JP] Japan ................... 4-357145

[51] Int. Cl.⁶ .................................. G01R 31/308
[52] U.S. Cl. ................. 324/753; 324/96; 324/117 B
[58] Field of Search ................ 324/753, 96, 117 R

[56] References Cited

U.S. PATENT DOCUMENTS

| | | |
|---|---|---|
| 3,873,209 | 3/1975 | Schinke et al. . |
| 4,322,979 | 4/1982 | Fromm . |
| 4,490,618 | 12/1984 | Ciclo . |
| 4,681,451 | 7/1987 | Guerra et al. . |
| 4,864,222 | 9/1989 | Aoshima et al. ............ 324/96 |
| 4,865,453 | 9/1989 | Gidon et al. . |
| 4,866,372 | 9/1989 | Aoshima et al. ............ 324/96 |
| 4,982,151 | 1/1991 | Takahashi et al. .......... 324/96 |
| 5,028,132 | 7/1991 | Hickel et al. . |
| 5,125,740 | 6/1992 | Sato et al. . |
| 5,225,690 | 7/1993 | Sakai et al. . |
| 5,233,291 | 8/1993 | Kouno et al. . |
| 5,239,183 | 8/1993 | Kouno et al. . |

FOREIGN PATENT DOCUMENTS

| | | |
|---|---|---|
| 58-2602 | 6/1981 | Japan . |
| 63-111403 | 10/1986 | Japan . |
| 63-255606 | 4/1987 | Japan . |
| 63-263401 | 4/1987 | Japan . |
| 90/04753 | 5/1990 | WIPO . |

*Primary Examiner*—Kenneth A. Wieder
*Assistant Examiner*—Kourosh Cyrus Khosravi
*Attorney, Agent, or Firm*—Ostrolenk, Faber, Gerb & Soffen, LLP

[57] ABSTRACT

The present invention provides a novel sensor preferably used for non-destructive measurement of the electrical characteristics of semiconductors. The sensor is easily manufactured and has a sufficiently high dielectric breakdown strength. The sensor includes an electrode mount 64 having a an electrode pattern 200 formed on a bottom surface 66a of a cone glass 66. The bottom surface 66a has a reflecting plane 66c for reflecting a laser beam, a test electrode 201, and three parallelism adjustor electrodes 111 through 113 formed around the reflecting plane 66c. The bottom surface 66a also has a guard ring 120 disposed between the test electrode 201 and the parallelism adjustor electrodes 111 through 113. An insulating film 68 covers a lower surface of the cone glass 66. Wiring formed on a inclined face 66b of the cone glass 66 is connected to external lead wires at the upper end of the wiring. Since the cone glass 66 has two flat surfaces parallel to each other, the electrode pattern 200 is easily formed on the bottom surface 66a by photo lithography. The insulating film 68 effectively works to improve the dielectric breakdown strength.

12 Claims, 17 Drawing Sheets

NON-DESTRUCTIVE MEASURING SENSOR FOR SEMICONDUCTOR WAFER AND METHOD OF MANUFACTURING THE SAME

BACKGROUND OF THE INVENTION

1. Field of the Invention

The present invention relates to a sensor used for non-destructive measurement of electrical characteristics of semiconductor wafers, and to a method of manufacturing the same.

2. Description of the Related Art

C—V curve measurement is one of the well-known methods used for evaluating the characteristics of a metal-insulator-semiconductor (MIS) diode.

In conventional C—V curve measurement, an electrode is formed on a surface of the oxide film on a semiconductor wafer. Formation of such an electrode, however, affects electrical characteristics of the semiconductor wafer and furthermore takes much labor and time. The inventors has therefore developed a novel non-destructive measuring apparatus for evaluating the electrical characteristics of a semiconductor wafer including a C—V curve and a C—t curve without forming any electrode on a surface of the semiconductor wafer.

FIGS. 1(a) through 1(c) show principles of a non-destructive measuring apparatus for semiconductors developed by the inventors. As shown in FIG. 1(a), an oxide film 102 is formed on a surface of a semiconductor substrate 101, and an electrode 202 is formed on the other surface of the semiconductor substrate 101. Another electrode 201 is held apart from the oxide film 102 across a gap Ge by an electrode holder unit 300. The electrode holder unit 300 adjusts the gap Ge to be no more than about 1 μm. The detailed structure of the non-destructive measuring apparatus and the method of measuring the gap are described in U.S. Pat. No. 5,233,291, the disclosure of which is incorporated by reference herein.

FIG. 1(b) shows an equivalent circuit of the structure shown in FIG. 1(a). The equivalent circuit between the electrodes 201 and 202 includes a series combination of a substrate capacitance Cs, an oxide capacitance Ci, and a gap capacitance Cg. The C—V curve is voltage dependency of a semiconductor capacitance Cta, which is a composite capacitance of the series combination of the capacitances Cs and Ci. What is measured by a measurement unit 400, however, is not the semiconductor capacitance Cta but the total capacitance Ct between the electrodes 201 and 202. The gap Ge can be precisely measured by the electrode holder unit 300, and the electrostatic capacitance Cg is determined according to the measured value of the gap Ge. The semiconductor capacitance Cta is then obtained by subtracting the gap capacitance Cg from the total capacitance Ct measured by the measurement unit 400.

The precision of the gap measurement and that of the electrical characteristics measurement depends upon the structure of the sensor having the measuring electrode 201. However, since there has been no apparatus Which perform non-destructive measurement of the electrical characteristics of semiconductors, no sensors suitable for such apparatus have been known.

The structure of the sensor is required to be simple enough to form a fine electrode pattern on a surface of the sensor. The dielectric breakdown strength of the sensor is required to be considerably high because the gap between the sensor and the semiconductor wafer is kept no more than about 1 μm and because the electric field across the gap is to be very strong accordingly.

SUMMARY OF THE INVENTION

An object of the present invention is to provide a sensor which is suitable for non-destructive measurement of the electrical characteristics of semiconductors, and which can be easily manufactured.

Another object of the present invention is to provide a sensor suitable for the non-destructive measurement which has a sufficiently high dielectric breakdown strength.

The present invention is directed to a sensor for use in non-destructive measurement of electrical characteristics of a semiconductor wafer. The sensor comprises: a transparent member having a first flat surface and a second flat surface substantially parallel with each other, where the first flat surface is to be spaced substantially in parallel from a surface of the semiconductor wafer to be measured, and the first flat surface has a reflecting plane to reflect a light beam introduced into the transparent member under geometrical total reflection conditions; and a test electrode formed on the first flat surface.

Since the translucent member has the two flat surfaces substantially parallel to each other, the test electrode can be easily formed on the first flat surface, by photo lithography for example.

According to an aspect of the present invention, the sensor comprises an insulating film covering at least the test electrode on the first flat surface.

The insulating film significantly improves the dielectric breakdown strength of the sensor.

In a preferred embodiment of the present invention, the sensor further comprises: light introducing means for introducing the light beam into the transparent member to be reflected by the reflecting plane.

The light introducing means comprises a prism attached to the second flat surface of the transparent member.

The transparent member includes a sloping part having an inclined side face extending from the first flat surface.

The sloping part has a shape of a truncated cone having the first flat surface and the inclined side face.

The first flat surface of the transparent member includes a step part at the circumference thereof and a central part inside the step part, whereby the step part is to be spaced farther from the semiconductor wafer than the central part.

The sensor further comprises: a wire attached on the inclined face of the sloping part and connected to the test electrode; and conductive means electrically connected with the wire on the inclined side face.

The test electrode includes a ring-shaped part surrounding the reflecting plane.

The sensor further comprises a plurality of first conductive layers each being formed on the first flat surface of the transparent member, the plurality of first conductive layers having an identical shape with each other placed symmetrically about the ring-shaped part of the test electrode and being separated to be insulated from the test electrode.

The sensor still further comprises a second conductive layer formed on the first flat surface of the transparent member among the ring-shaped part of the test electrode and the plurality of first conductive layers, the second conductive layer being separated to be insulated from the ring-shaped part of the test electrode and the plurality of first conductive layers.

According to another preferred embodiment of the present invention, the test electrode is embedded in the first flat surface such that a surface of the test electrode is level with the first flat surface.

Alternatively, the test electrode is embedded in the first flat surface such that a surface of the test electrode is to be spaced farther from the semiconductor wafer than the first flat surface.

The present invention is also directed to a sensor comprising: a transparent member having a light-introducing plane, a reflecting plane, and a light-emitting plane, whereby a light beam is introduced into the transparent member from the light-introducing plane and reflected by the reflecting plane under geometrical total reflection conditions to thereby emanate from the light-emitting plane, the reflecting plane being to be spaced substantially in parallel from a surface of the semiconductor wafer to be measured; and a test electrode formed on the reflecting plane.

In a preferred embodiment, the sensor further comprises: an insulating film covering at least the test electrode on the reflecting plane.

The present invention is further directed to a method of manufacturing a sensor for use in non-destructive measurement of electrical characteristics of a semiconductor wafer. The method comprises the steps of: (a) preparing a transparent member having a first flat surface and a second flat surface substantially parallel with each other, the first flat surface being to be spaced substantially in parallel from a surface of the semiconductor wafer to be measured, the first flat surface having a reflecting plane to reflect a light beam introduced into the transparent member under geometrical total reflection conditions; and (b) forming a test electrode on the first flat surface.

According to an aspect of the present invention, the method further comprises the steps of: (c) forming an insulating film for covering at least the electricity measuring electrode on the first surface.

In a preferred embodiment, the step (a) comprises the steps of: (a-1) preparing a transparent material having two flat surfaces substantially parallel to each other; (a-2) working the transparent material to make the transparent member having a sloping part, the sloping part having an inclined side face extending from the first flat surface.

The sloping part has a shape of a truncated cone having the first flat surface and the inclined side face.

The step (a) further comprises the step of: (a-3) making a step part at the circumference of the first flat surface of the sloping part and a central part inside the step part, such that the step part is to be spaced farther from the semiconductor wafer than the central part.

The step (a) further comprises the step of: (a-4) forming a groove for the test electrode on the first flat surface; and the step (b) comprises the step of: depositing the test electrode in the groove such that a surface of the test electrode is level with the first flat surface.

Alternatively, the step (a) further comprises the step of: (a-4) forming a groove for the test electrode on the first flat surface; and the step (b) comprises the step of: depositing the test electrode in the groove such that a surface of the test electrode is to be spaced farther from the semiconductor wafer than the first flat surface.

Preferably, the method further comprises, as well as the steps (a) through (c), the step of (d) holding the transparent member such that the reflecting plane is spaced substantially in parallel with the surface of the semiconductor wafer; and (e) applying and increasing a direct-current voltage between the semiconductor wafer and the test electrode to cause spark discharging, to thereby improve a dielectric breakdown strength of the test electrode.

These and other objects, features, aspects, and advantages of the present invention will become more apparent from the following detailed description of preferred embodiments with the accompanying drawings.

DESCRIPTION OF THE PREFERRED EMBODIMENT

A. Structure of Apparatus

Figure 2:
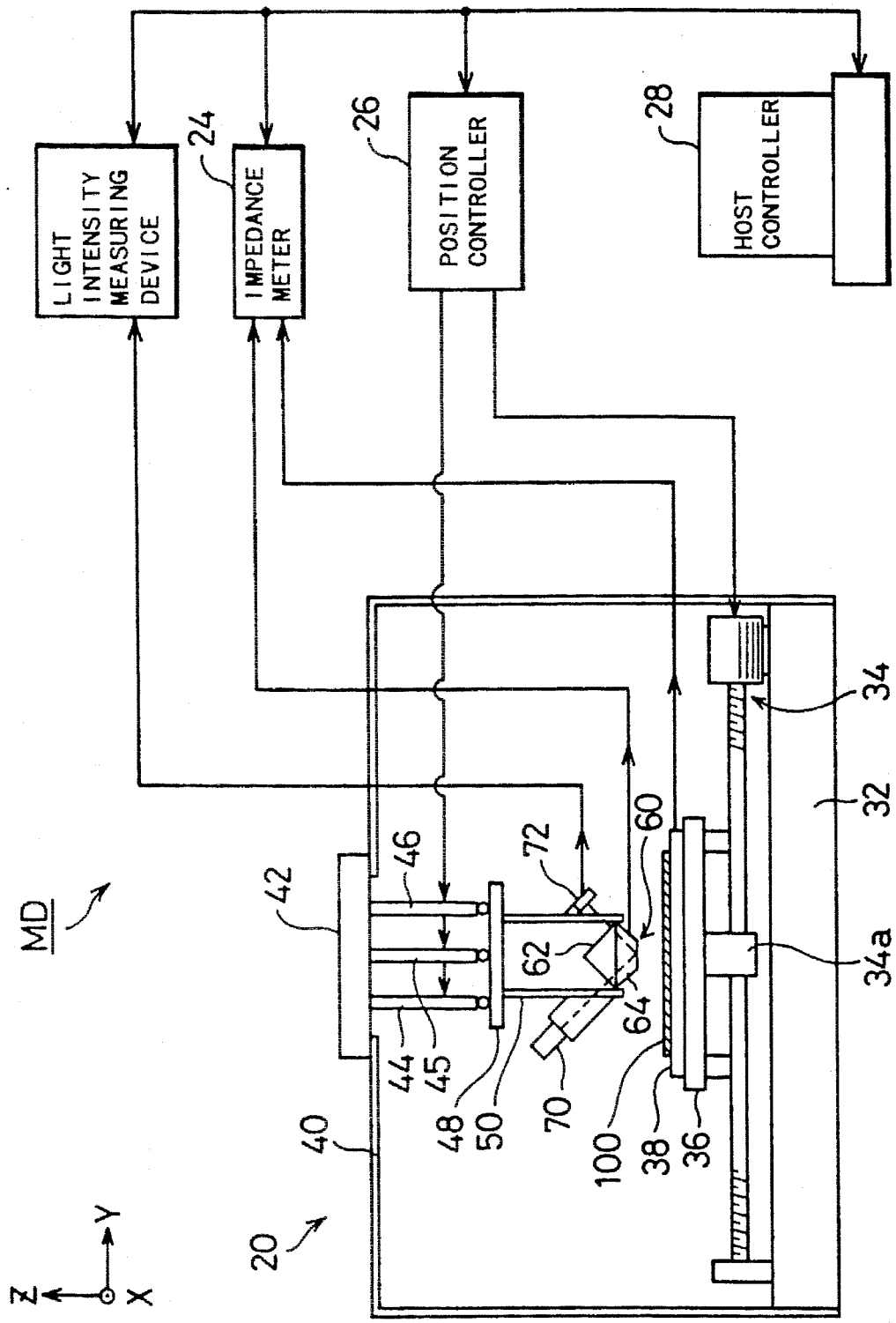
FIG. 2 illustrates a no-destructive measuring apparatus MD with a sensor embodying the present invention.

FIG. 2 illustrates a non-destructive measuring apparatus MD comprising a sensor embodying the present invention.

The measuring apparatus MD comprises a testing unit 20, a light-intensity measuring device 22, an impedance meter 24, a position controller 26, and a host controller 28. The intensity measuring device 22, the impedance meter 24, and the position controller 26 are connected to the host controller 28 such as a personal computer, which controls the whole apparatus and performs processing of measured data transmitted from the devices 22, 24, and 26.

The testing unit 20 includes a base 32, a driving unit 34 mounted on the base 32, a stand 36 engaged with a ball thread 34a of the driving unit 34, and a sample table 38 disposed on the stand 36. The sample table 38, which is an X—Y plane, supports the semiconductor wafer 100 mounted thereon as a sample and is driven by a motor (not shown) to rotate.

A flange 42 is bolted to an upper opening of a casing 40 of the testing unit 20, and three piezoelectric actuators 44, 45, and 46 are arranged below the flange 42 in a triangle formation. A support plate 48 is engaged under the three piezoelectric actuators 44, 45, and 46, and a sensor head 60 is fixed near the bottom end of a support cylinder 50 extending under the support plate 48. The support plate 48 is linked with the flange 42 by means of a plurality of springs (not shown) so that the piezoelectric actuators 44, 45, and 46 are pressed between the plate 48 and the flange 42. The sensor head 60 includes a rectangular prism 62 for transmitting a laser beam and a transparent electrode mount 64 which is fixed to the bottom surface of the rectangular prism 62 with an optical adhesive.

A laser source 70 such as a GaAlAs laser, and a photosensor 72 such as a photo diode, are fixed respectively to the opposite side faces of the support cylinder 50.

A laser beam emitted from the laser source 70 passes through the rectangular prism 62 to enter the electrode mount 64 and is reflected from a bottom face of the electrode mount 64 under geometrical total optical reflection conditions of geometrical optics. The reflected laser beam again passes through the rectangular prism 62 to be received by the photosensor 72.

In measuring the electrical characteristics of the semiconductor wafer 100, a bottom face of the sensor head 60 is spaced from the surface of the semiconductor wafer 100 across a gap of no more than about one micrometer. An optical measuring system including the laser source 70, the sensor head 60, and the photosensor 72 precisely and accurately measures the gap by utilizing evanescent light reflected from the bottom face of the sensor head 60 under geometrical total reflection conditions. The detailed method of measuring the gap are described in U.S. Pat. No. 5,233,291, the disclosure of which is incorporated by reference herein.

The three piezoelectric actuators 44, 45, and 46 are controlled by the position controller 26 to move the sensor head 60 in the Z direction and further to make the bottom face of the sensor head 60 substantially parallel to the semiconductor wafer 100.

The photosensor 72 is connected to the intensity measuring device 22, and the impedance meter 24 is connected to electrodes formed on the bottom face of the sensor head 60 as well as to the metal sample table 38. The impedance meter 24 measures a capacitance or a conductance between each electrode on the bottom face of the sensor head 60 and the sample table 38.

B. Basic Structure of Electrode Mount 64

Figure 3A:
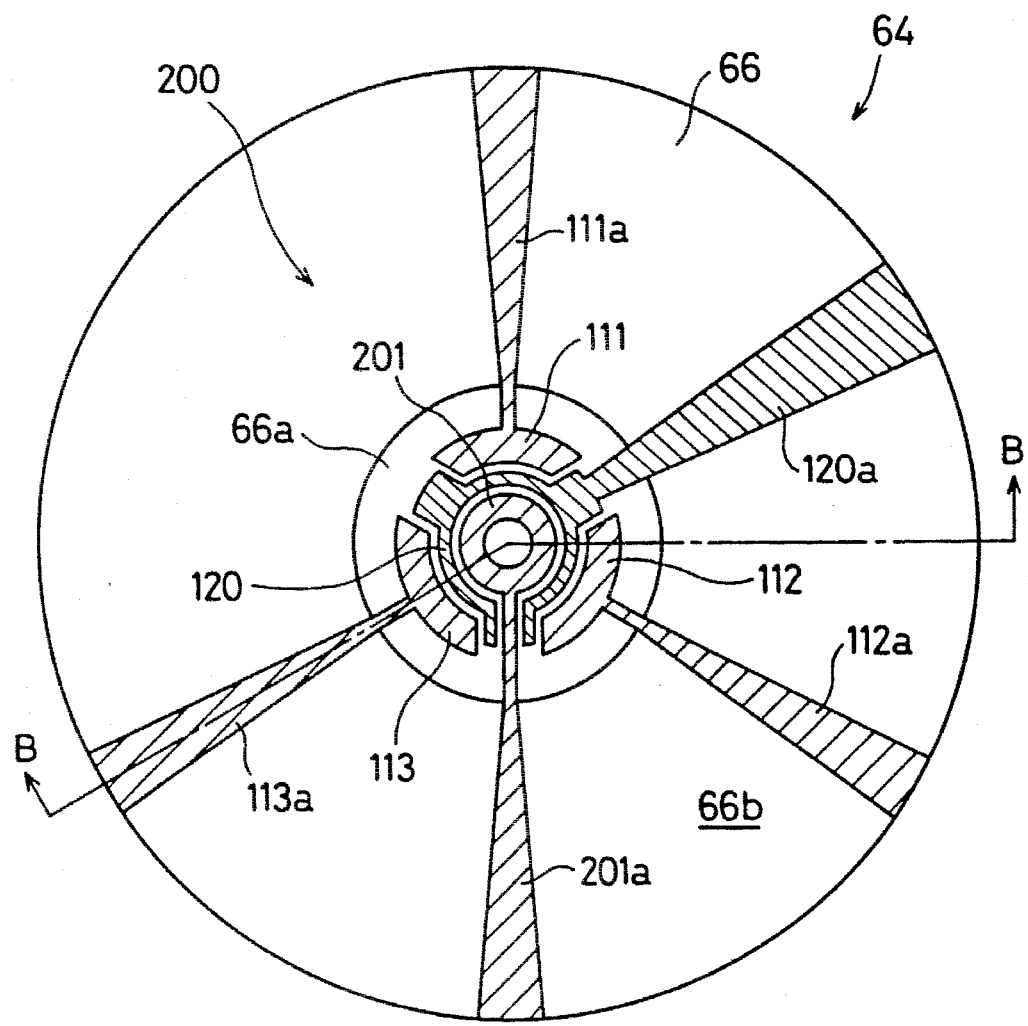
FIG. 3(A) is a bottom view of an electrode mount 64 and FIG. 3(B) is a cross sectional view of the electrode mount 64 taken on the line B—B of FIG. 3(A)
Figure 3B:
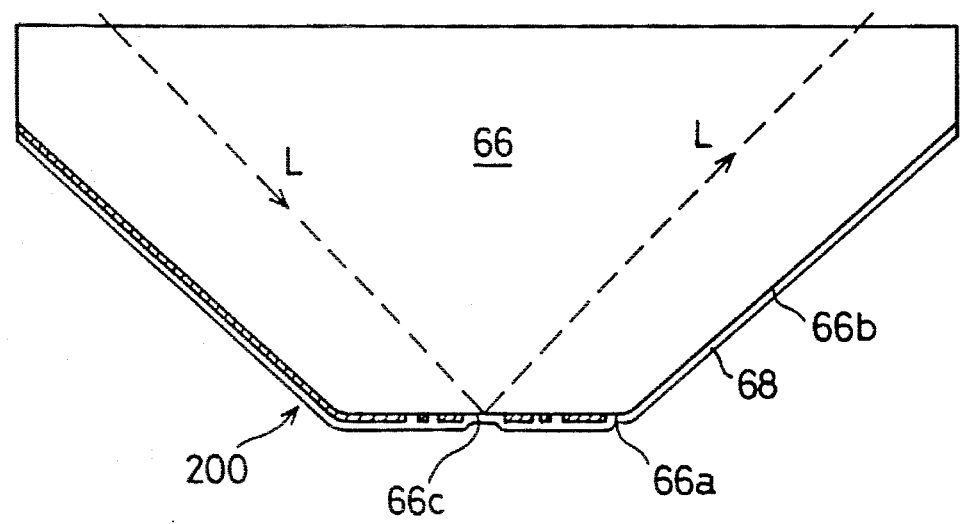

FIG. 3(A) is a bottom view of the electrode mount 64, and FIG. 3(B) is a cross sectional view of the electrode mount 64 taken on the line B—B of FIG. 3(A). The electrode mount 64 is constituted by a cone glass 66 made of optical glass having a shape like an inverted truncated cone, an electrode pattern 200 formed on a bottom surface 66a of the cone glass 66, and an insulating film 68 for covering over the bottom surface 66a and an inclined face 66b of the cone glass 66. The electrode pattern 200 includes a test electrode 201, three parallelism adjustor electrodes 111 through 113, a guard ring 120, and wires 201a, 111a, 112a, 113a, and 120a respectively connected to the electrodes 201, 111, 112, 113, and 120. These wires extend from the bottom surface 66a to cross over the inclined face 66b of the cone glass 66. The cone glass 66 is prepared by polishing and tapering a side wall of disk-shaped glass as described later. Since the cone glass 66 has the bottom surface 66a and a top surface parallel to each other, the electrode pattern 200 can be easily formed on the bottom surface 66a by photo lithography.

The test electrode 201 has a ring shape having a circular opening in its center. The cone glass surface in the center of the electrode 201 forms a reflecting plane 66c which reflects a laser beam L under geometrical total reflection conditions. In this embodiment, the test electrode 201 has an inner diameter of 0.5 mm and an outer diameter of 1.0 mm.

The three parallelism adjustor electrodes 111 through 113 have an identical arc shape divided from a certain ring. In this embodiment, the certain ring defined by the parallelism adjustor electrodes 111 through 113 has an inner diameter of 1.6 mm and an outer diameter of 2.4 mm. The electrodes 111, 112, and 113 are spaced apart from one another by 0.7 mm. The electrodes 111 through 113 may have a circular shape instead. The arc-shape of the electrodes 111 through 113 as shown in FIG. 3(A) are preferable to the circular shape because it allows a greater area in a certain region.

The electrodes 111 through 113 are used for adjusting parallelism between the bottom surface 66a of the cone glass 66 and the surface of the semiconductor wafer 100. More concretely, a slope of the bottom surface 66a of the cone glass 66 is adjusted so as to make capacities of electrodes 111, 112, 113 equal to each other, by controlling the piezoelectric actuators 44, 45, and 46. The bottom surface 66a of the cone glass 66 is thereby made parallel to the surface of the semiconductor wafer 100.

The guard ring 120 is an ring electrode disposed between the test electrode 201 and the parallelism adjustor electrodes 111 through 113, and has an inner diameter of 1.2 mm and an outer diameter of 1.4 mm. The guard ring 120 is kept to have a predetermined electric potential (for example, ground potential) to prevent interactions between the four electrodes 201 and 111 through 113. The guard ring 120 makes the capacitance measurement by the test electrode 201 free from any influences of the parallelism adjustor electrodes 111 through 113. This significantly improves precision of the electric characteristics measurement. The guard ring 120 also makes the capacitance measurement of each parallelism adjustor electrode 111, 112, or 113 free from influences of the other parallelism adjustor electrodes, and thereby the parallelism between the bottom surface 66a of the cone glass 66 and the surface of the semiconductor wafer 100 can be adjusted with higher precision.

Each gap between the electrodes 201 and 111 through 113, and between the electrodes 111 through 113 and the guide ring 120 is 0.1 mm. The width of each wiring 201a, 111a through 113a on the bottom surface 66a is 0.1 mm.

Figure 4:
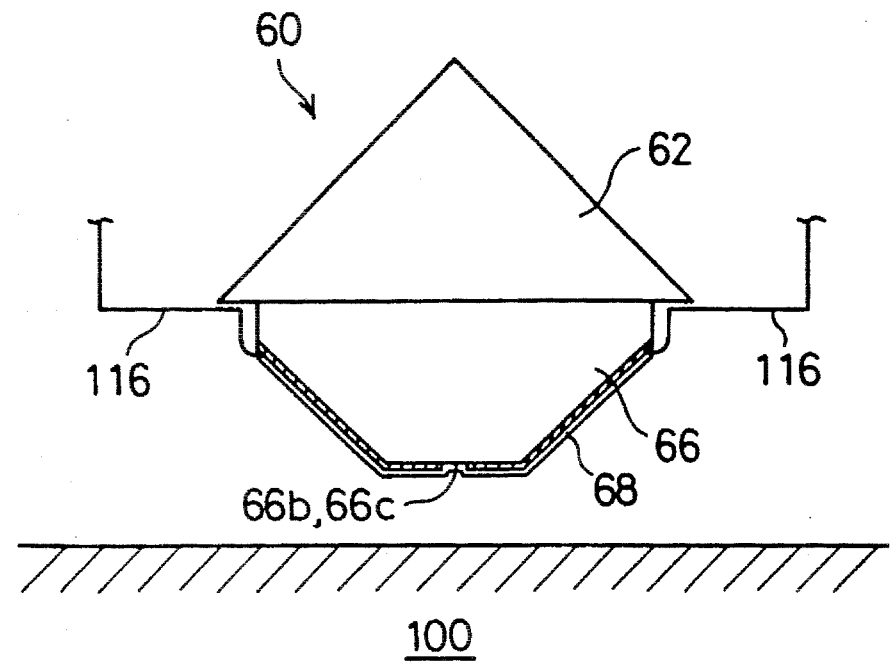
FIG. 4 is a front view of a sensor head 60 showing connection of wiring.

FIG. 4 is a front view showing the connection of the wiring of the sensor head 60. The wires 111a through 113a, 120a, and 201a on the cone glass 66 are connected with respective external lead wires 116 at an upper end of the inclined face 66b of the cone glass 66. Connection of the wires is typically implemented by wire bonding or hardening silver paste. Each joint of the wires may rise by several hundred micrometers. In this arrangement, each wiring is connected to the lead wire at a position sufficiently apart from the bottom surface 66a of the cone glass 66, and this effectively prevents the wiring joint from being pinched between the bottom surface 66a of the cone glass 66 and the surface of the semiconductor wafer 100. In measuring the electric characteristics of the semiconductor wafer 100, the gap between the bottom surface 66a of the cone glass 66 and the surface of the semiconductor wafer 100 is set equal to one micrometer or less. If the wiring joint of several hundred micrometers were located in the vicinity of the bottom surface 66a, the wiring joint would be brought into contact with the semiconductor wafer 100. Since the cone glass 66 has a shape like a truncated cone, the wires can be jointed at positions sufficiently apart from the bottom surface 66a.

The insulating film 68 is made of silicon dioxide ($SiO_2$) having a thickness of about 50 nm formed by high-frequency sputtering. The insulating film 68 can be made of silicon nitride ($Si_3N_4$) or a variety of plastics instead. The insulating film 68 of silicon nitride or plastics can be formed by CVD (Chemical Vapor Deposition) including thermal CVD and plasma CVD), and by PVD (Physical Vapor Deposition). The silicon oxide film can be formed by thermally oxidizing polysilicon deposited on the cone glass 66. Alternatively, the insulating film 68 of a metal oxide such as $Cr_2O_3$, $Al_2O_3$, and $Ta_2O_3$, can be prepared by thermal oxidation or anodic oxidation. Any of these methods can precisely control the thickness of the insulating film 68. The insulating film 68 can also be prepared by applying $SiO_2$ glass or Teflon (a trademark of polytetrafluoroethylene) for SOG (Spin On Glass) on the cone glass 66.

The insulating film 68 can be prepared by either of the following two procedures. In a first procedure, after the wiring on the cone glass 66 is connected to the external lead wires 116, the insulating film 68 is formed on the whole lower face of the cone glass 66. Connection of the wiring is accomplished by wire bonding or hardening silver paste. In this first procedure, it is preferable that the temperature for forming the insulating film 68 is set no more than about 200° C. to prevent the connection from being broken away. In a second procedure, the insulating film 68 is formed on the whole lower face of the cone glass 66 before the wiring on the cone glass 66 is connected to the external lead wires 116. A specific part of the insulating film 68 covering over the joint of the wiring is then removed by pattern etching or physical break-away process to allow the wiring to be connected with the lead wires 116. In this second procedure, it is preferable that the temperature for forming the insulating film 68 is set no more than a softening temperature of the cone glass 66. If the cone glass 66 is composed of BK7, the forming temperature of the insulating film 68 should be no more than about 500° C. If the cone glass 66 is composed of quartz glass, the forming temperature is preferably no more than a softening temperature of the wiring on the cone glass 66.

The thickness and material of the insulating film 68 are required to meet the following criteria. In measuring the electrical characteristics of a semiconductor wafer, the gap between the semiconductor wafer and the test electrode 201 is set equal to about 200 nm (=0.2 μm) at the minimum. The thickness of the insulating film 68 is thereby to be no more than about 200 nm. Since a direct current bias of about 20 volts is applied between the semiconductor wafer and the test electrode 201, the dielectric breakdown voltage of the sensor head 60 is preferably no less than about 20 volts. Especially, in measuring the electrical characteristics of a bare semiconductor wafer, which has no insulating film on the surface thereof, it is preferable that the insulating film 68 of the sensor head 60 has the dielectric breakdown voltage of about 20 volts. The thickness of the insulating film 68 is therefore determined according to the material to attain the dielectric breakdown voltage of about 20 volts. The preferable thickness is about 50 nm for silicon dioxide, which has the dielectric breakdown strength of about 4 MV/cm.

Although the insulating film 68 is formed on the whole lower face of the cone glass 66 in the embodiment shown in FIG. 3(B), the insulating film 68 is only required to cover the test electrode 201 of the bottom surface 66a and not required to cover the other electrodes or the bare surface of the cone glass 66. The inclined face 66b of the cone glass 66 is also not required to be covered with the insulating film 68. The insulating film 68 may not be formed in the vicinity of the wiring joints at the upper portion of the cone glass 66, and this structure allows the wiring on the cone glass 66 to be more easily connected with the external lead wires 116.

Figure 5:
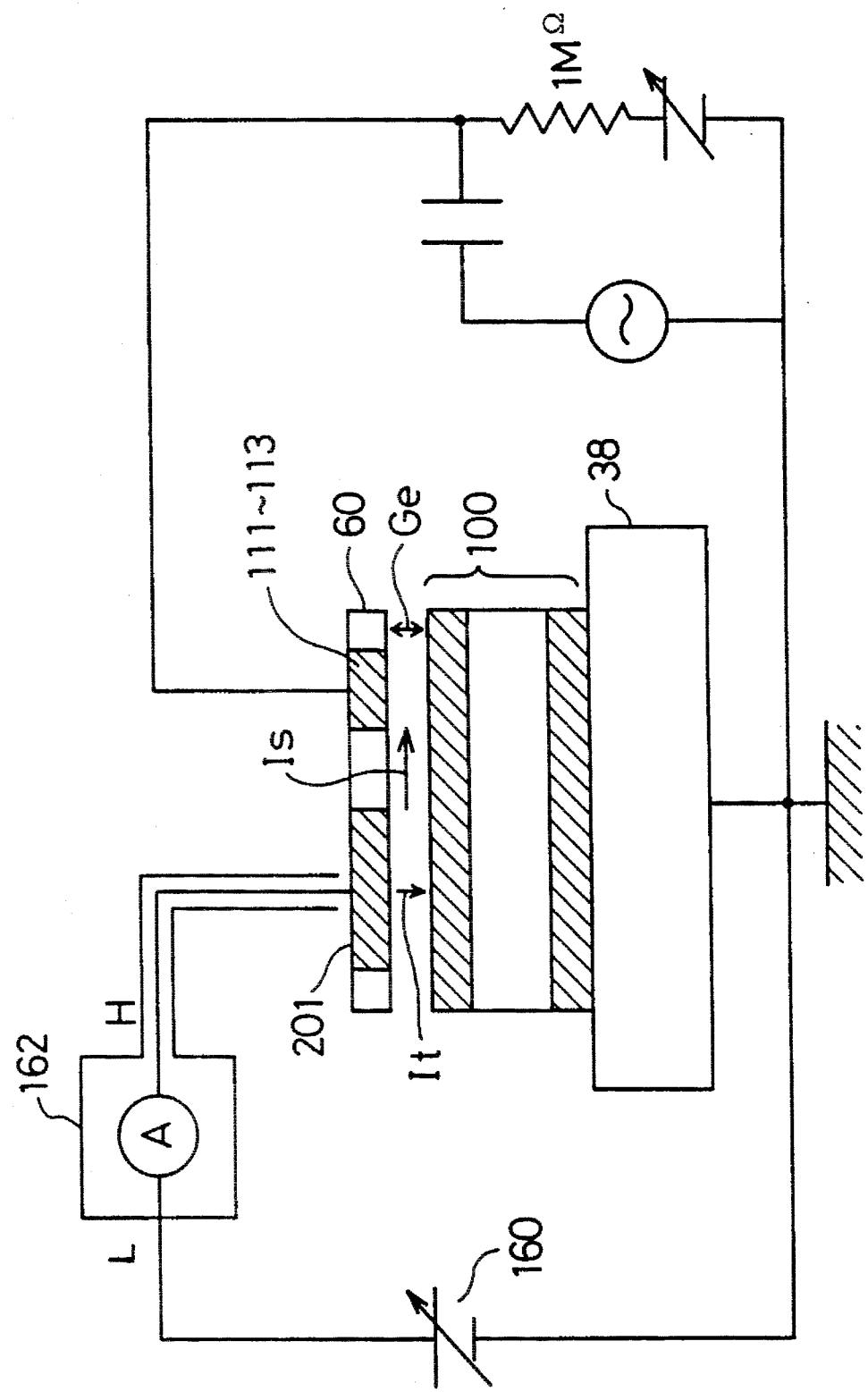
FIG. 5 shows an electric construction of the non-destructive measuring apparatus in measuring the dielectric breakdown strength of the sensor head 60.

The dielectric breakdown voltage was measured for the sensor head 60 with the insulating film 68 in the nondestructive measuring apparatus MD of FIG. 2. FIG. 5 is a schematic view showing the electric, construction of the measuring apparatus MD in measuring the dielectric breakdown voltage. A direct current power source 160 for C—V curve measurement and an ammeter 162 are connected in series between the test electrode 201 and the conductive sample table 38, on which the semiconductor wafer 100 is mounted. Another power circuit for adjusting parallelism is connected between the sample table 38 and the three parallelism adjustor electrodes 111 through 113. The test electrode 201 is biased to a positive electric potential with respect to the semiconductor wafer 100 by the direct current power source 160. The electric current measured by the ammeter 162 is a total of an electric current It running between the test electrode 201 and the semiconductor wafer 100 and a leak current Is running between the test electrode 201 and the parallelism adjustor electrodes 111 through 113. The electric current It is negligibly small before breakdown, but it becomes much greater than the leak electric current Is, that is, Is<<It, after the breakdown.

Figure 6A:
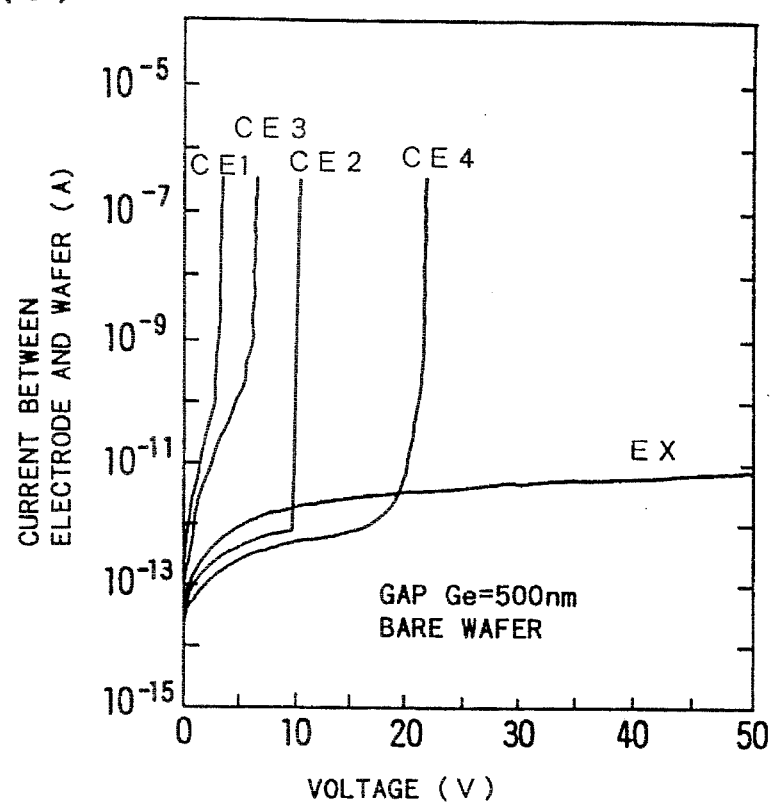
FIGS. 6(a) and 6(b) are graphs showing results of a dielectric strength test for the sensor head 60 of the embodiment and effects of a conditioning process.

FIG. 6(a) shows the results of the dielectric strength test using a bare semiconductor wafer, where the voltage of the direct current power source 160 was gradually increased. The control examples CE1 through CE4 show the results for four sensor heads with no insulating film whereas the example EX represents the results for the sensor head of the embodiment having the insulating film 68, which was made of $SiO_2$ having a thickness of 50 nm prepared by high-frequency sputtering. Breakdown was observed at a voltage of no more than about 20 volts in the control examples CE1 through CE4 whereas insulation was kept up to 50 volts in the example EX.

The above experiments show that the insulating film 68 significantly improves the dielectric breakdown strength of the sensor head. The electrical characteristics of bare semiconductor wafers and those of semiconductor wafers having a thin insulating film on their surface can be efficiently measured with the sensor head 60 having the insulating film 68. Since the insulating film 68 prevents the electrodes from being brought into direct contact with the semiconductor wafer, it has the function to protect the electrodes.

The insulation film 68 on the sensor head 60, however, can be omitted in measuring the electrical characteristics of the semiconductor wafers which have a relatively thick insulating film.

Figure 6B:
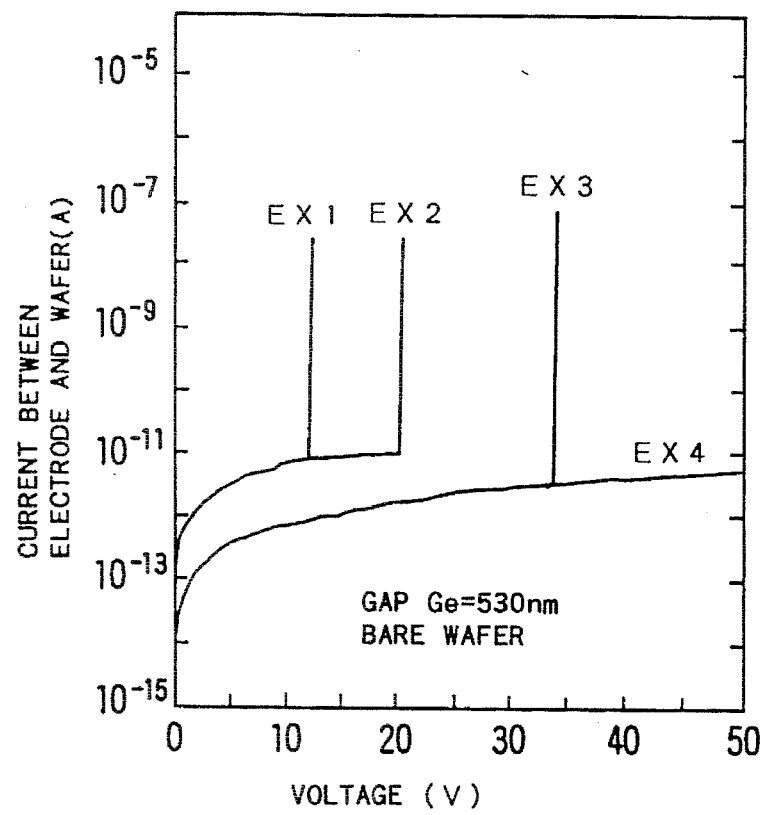

FIG. 6(b) is a graph showing the effects of a conditioning process executed for the sensor head 60 having the insulating film 68. The conditioning process means to cause spark discharge between the test electrode 201 and the semiconductor wafer 100 to improve the dielectric breakdown strength of the sensor head 60. The examples EX1 through EX4 in the graph of FIG. 6(b) represent the results of continual measurement of the dielectric breakdown strength for the same sensor head. As clearly seen from the graph, the dielectric breakdown strength was increased every time the spark discharge occurred, which is indicated by a vertical line, from about 10 volts for the example EX1 up to more than 50 volts for the example EXt. The result of FIG. 6(b) shows that the conditioning process makes the sensor head to have a stable high dielectric breakdown strength. The improvement in the dielectric breakdown strength by the conditioning process is ascribed to removal of projected conductive particles adhering to the test electrode 201 due to the spark discharge.

Although the spark discharge in the conditioning process generally forms fine pin holes in the insulating film 68, the area of such pin holes is sufficiently smaller than the surface area of the test electrode 201 and is thereby negligible in C—V and C—t measurement. The 'insulating film covering the test electrode' in the present invention includes those having fine pin holes.

The conditioning process may be performs during measurement of the electrical characteristics of a semiconductor wafer instead of during manufacture of the sensor head. In the former case, a specific circuit is installed to monitor the electric current measured by the ammeter 162 to turn off the direct current power source 160 when a predetermined amount of electric current (for example, about 0.01 μA) is detected.

Figure 7A:
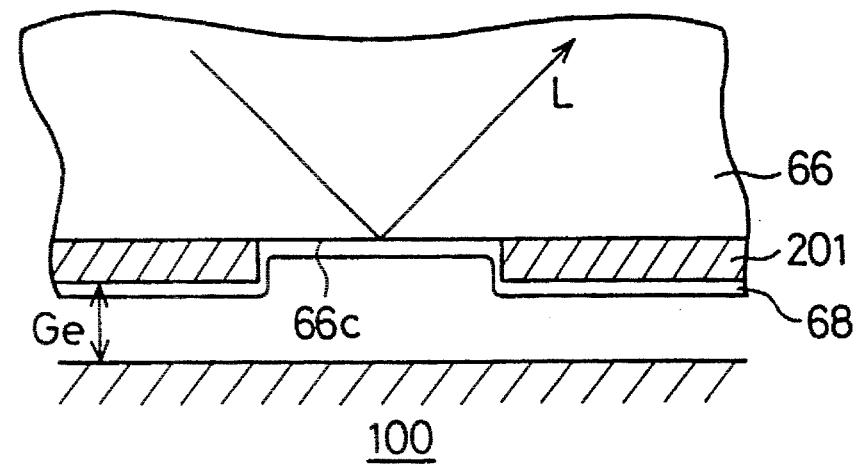
FIGS. 7(A) and 7(B) are cross sectional views respectively showing an optical path in the sensor head 60.
Figure 7B:
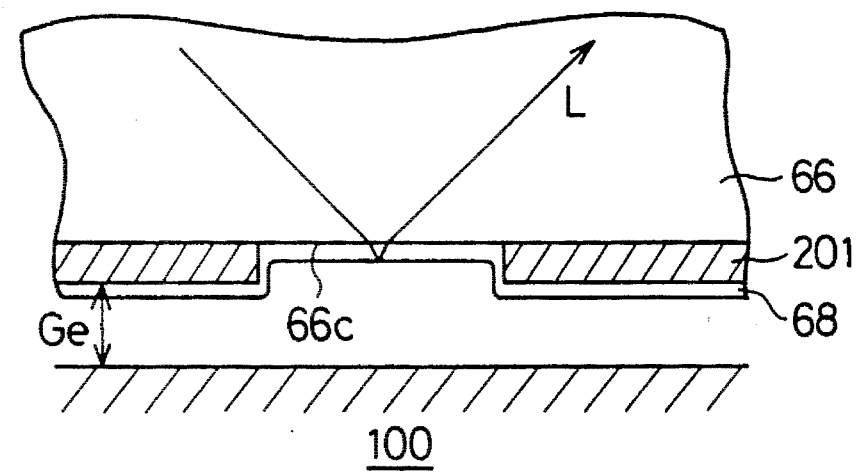

The optical path of laser beam L may be changed due to the insulating film 68 formed on the reflecting plane 66c of the cone glass 66. FIGS. 7(A) and 7(B) are enlarged views showing the optical path near the reflecting plane 66c of FIG. 3(B). When a refractive index of the insulating film 68 is relatively small, the laser beam L is totally reflected from the reflecting plane 66c of the cone glass 66 as shown in FIG. 7(A). When the refractive index of the insulating film 68 is relatively large, on the contrary, the laser beam L enters the insulating film 68 and is totally reflected from the surface of the insulating film 68 as shown in FIG. 7(B). In any case, the gap Ge between the test electrode 201 and the semiconductor wafer 100 can be determined from the intensity of the reflected laser beam L along with the thicknesses of the insulating film 68 and the test electrode 201, and the optical constants of the insulating film 68. The thicknesses of the insulating film 68 and the test electrode 201 can be measured with an interference microscope.

C. Wiring Structure for Reducing Parasitic Capacitance

Figure 8:
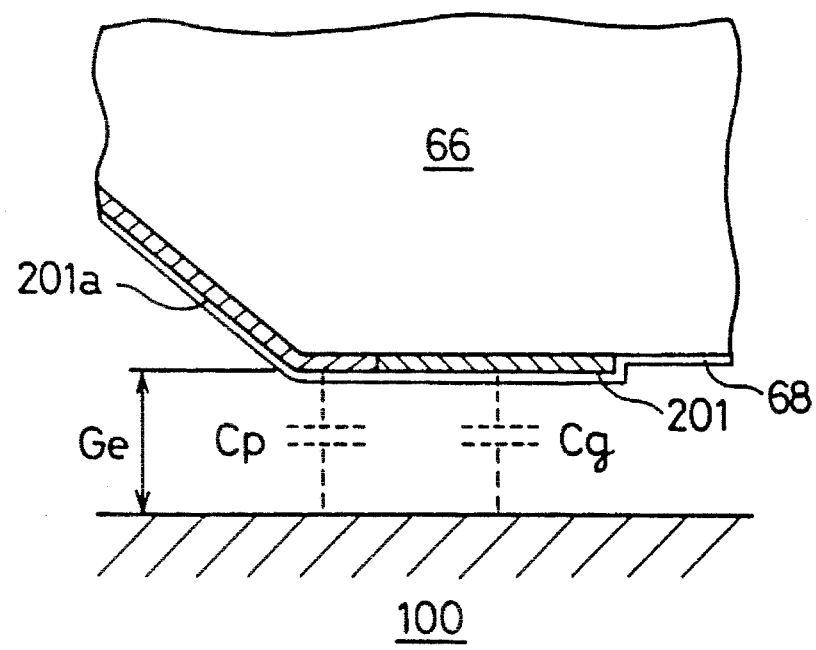
FIG. 8 is an expanded view of a part of the electrode mount 64.

The capacitance between the test electrode 201 and the semiconductor wafer 100 is measured for determination of the C—V curve and the C—t curve of the semiconductor wafer 100. Since the electrode mount 64 shown in FIGS. 3(A) and 3(B) has the test electrode 201 and its wiring 201a on the bottom surface 66a of the cone glass 66, the gap capacitance Cm measured by the impedance meter 24 is expressed as:

$$Cm = Cg + Cp$$

where Cg denotes a gap capacitance between the test electrode 201 and the semiconductor wafer 100 and Cp denotes a parasitic capacitance between the wiring 201a and the semiconductor wafer 100. FIG. 8 schematically shows the cross section of the electrode mount 64 and the capacitances Cg and Cp.

The gap capacitance Cg and the parasitic capacitance Cp are respectively expressed as:

$$Cg = Sg \cdot \epsilon / Ge$$

$$Cp = Sp \cdot \epsilon / Ge$$

where Sg denotes an area of the test electrode 201, ε denotes a dielectric constant of the air, Ge denotes a gap between the electrode 201 and the surface of the semiconductor wafer 100, which is equal to a gap between the wiring 201a and the surface of the semiconductor wafer 100 in this structure, and Sp denotes an area of the wiring 201a.

Since the parasitic capacitance Cp is inversely proportional to the gap Ge, it can be determined according to a measured value of the gap Ge. However, the smaller parasitic capacitance Cp is preferable because the precision of measurement of the gap capacitance Cg becomes low if the parasitic capacitance Cp is comparative to the gap capacitance Cg.

As clearly understandable from the above equation of the parasitic capacitance Cp, reduction of the area Sp or increase in the gap Ge effectively decreases the parasitic capacitance Cp.

In this embodiment, the area Sp is reduced by tapering the width of the wiring 201a on the bottom surface 66a of the cone glass 66 as clearly seen in FIG. 3(A). The ratio of the area Sg of the test electrode 201 to the area Sp of the wiring 201a is about ten to one on the bottom surface 66a. This means that the parasitic capacitance Cp is about one tenth of the gap capacitance Cg.

Figure 9:
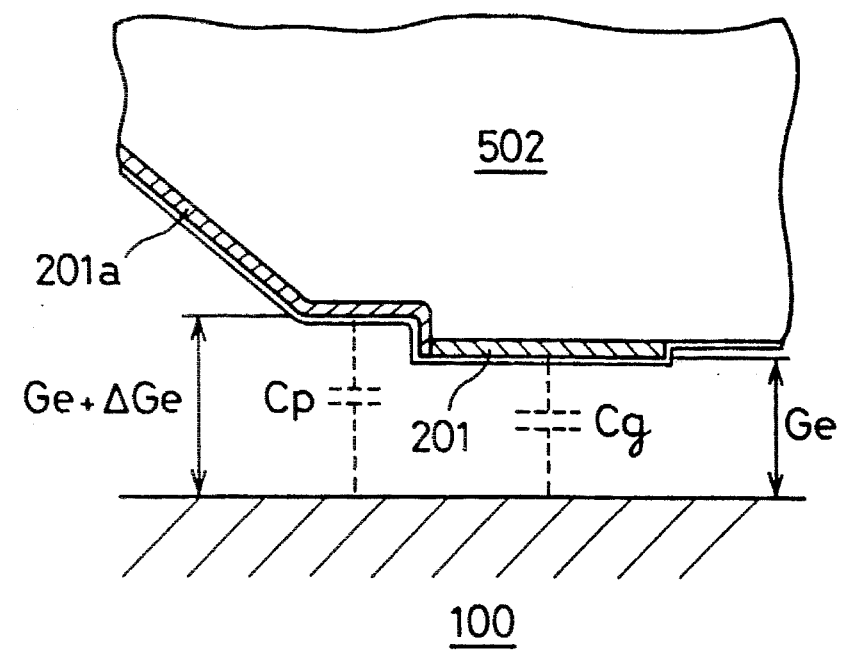
FIG. 9 schematically shows another electrode mount 500 according to the present invention.

Another method of reducing the parasitic capacitance Cp is to make a step on a part of the bottom surface of the cone glass where the wiring 201a is formed to increase the gap between the wiring 201a and the semiconductor wafer 100 as shown in FIG. 9. The gap capacitance Cg and the parasitic capacitance Cp in the structure of FIG. 9 are expressed as:

$$Cg = Sg \cdot \epsilon / Ge$$

$$Cp = Sp \cdot \epsilon / (Ge + \Delta Ge)$$

where ΔGe denotes a level difference.

Figure 10:
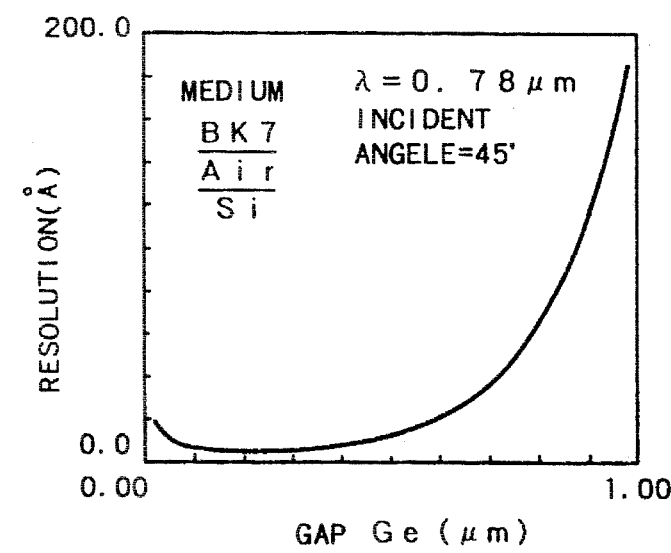
FIG. 10 is a graph showing the resolution in the gap measurement.

A preferable value of the level difference ΔGe depends on the actual gap Ge in measuring the electrical characteristics of semiconductor wafers. FIG. 10 is a graph showing the resolution in measurement of the gap Ge where the detection accuracy of the photosensor 72 (FIG. 2) is taken into consideration. According to the graph of FIG. 10, the optimum resolution is obtained when the gap Ge ranges from about 0.2 to about 0.3 micrometer. Since the precision of C—V curve measurement depends upon the precision of measurement of the gap Ge, the optimum distance of the gap Ge is in a range between about 0.2 and about 0.3 micrometer.

If the gap Ge is set equal to 0.2 μm and the level difference ΔGe is 2 μm, for example, the gap (Ge+ΔGe) between the wiring 201a and the semiconductor wafer 100 becomes equal to 2.2 μm, which is eleven times the gap Ge. Namely, the level difference ΔGe efficiently reduces the parasitic capacitance Cp to be one eleventh of the gap capacitance Cg. When the effect of the level difference ΔGe is combined with the increased ratio of the area Sg of the test electrode 201 to the area Sp of the Wiring 201a described above, the ratio of the gap capacitance Cg to the parasitic capacitance Cp is made about 100 to 1, and therefore the adverse effects of the parasitic capacitance Cp on the C—V measurement is efficiently reduced.

Figure 11:
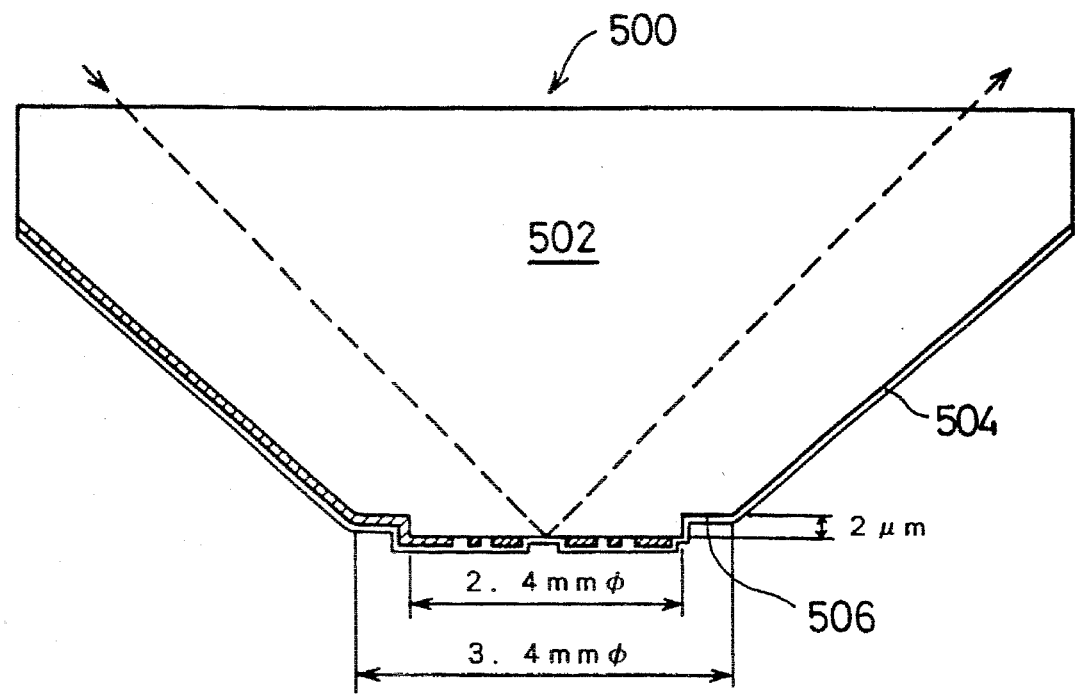
FIG. 11 is a cross sectional view of the electrode mount 500 having a stepped surface.

FIG. 11 is a cross sectional view of an electrode mount 500 having a step on a boundary between the electrode 201 and the wiring 201a, which is modified from that of FIG. 3(B). An insulating film 504 for covering the electrode pattern 200 is formed over the whole lower face of a cone glass 502. In the structure of FIG. 11, a ring-shaped step 506 is formed to have a level difference of 2 μm and an inner diameter of 2.4 mm, which corresponds to the circumference of the three parallelism adjustor electrodes 111 through 113 (FIG. 3(A)). The level difference of 2 μm is exaggerated in the drawing for convenience of illustration.

Figure 12:
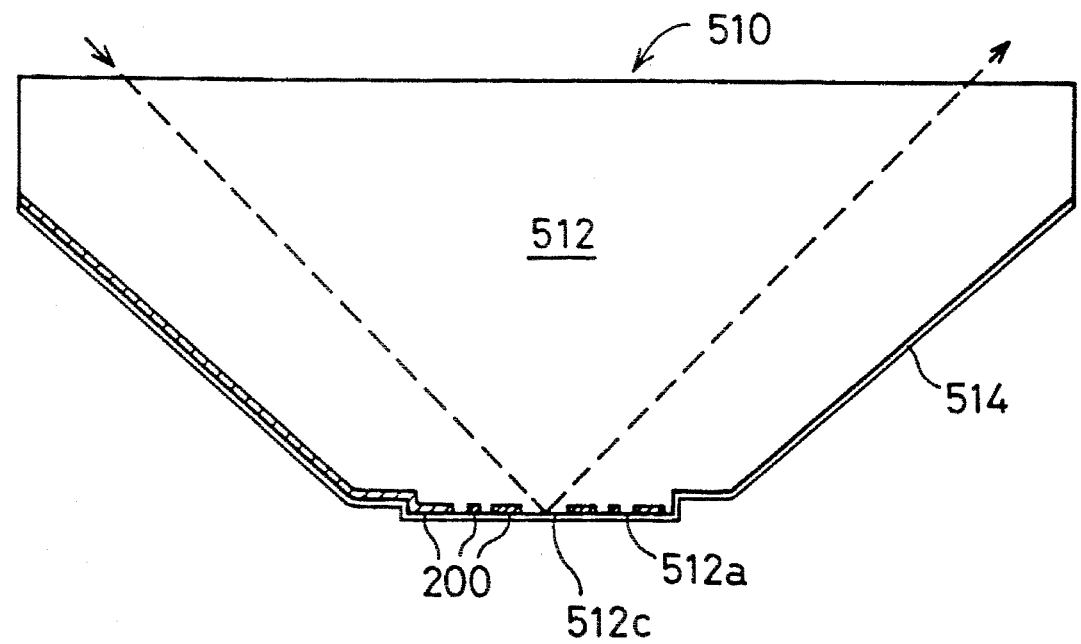
FIG. 12 is a cross sectional view of another electrode mount 510 according to the present invention.

FIG. 12 is a cross sectional view showing another electrode mount 510, which is further improved from the electrode mount 500 of FIG. 11. In the electrode mount 510, the electrode pattern 200 is embedded in a bottom surface 512a of a cone glass 512 while an insulating film 514 for covering the electrode pattern 200 is formed over the whole lower face of the cone glass 512. A reflecting plane 512c of the cone glass 512 has the same level as the surface of the electrode pattern 200, and this structure negates the necessity to consider a level difference between the reflecting plane 512c and the electrode surface.

Figure 13:
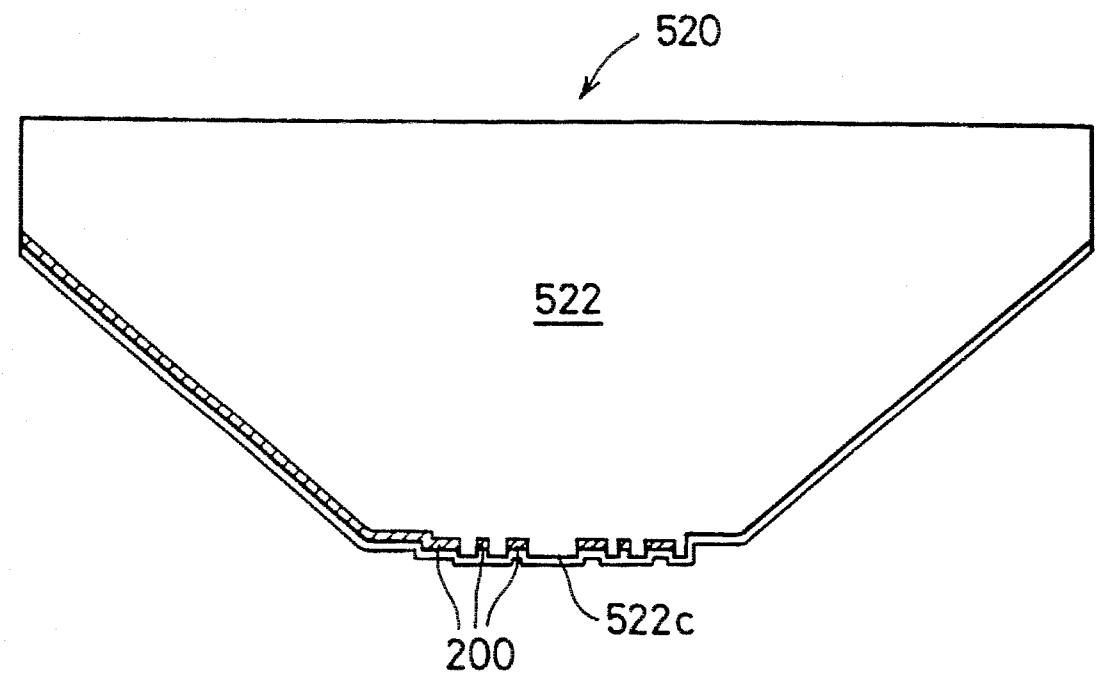
FIG. 13 is a cross sectional view of still another electrode mount 520 according to the present invention.

FIG. 13 is a cross sectional view illustrating still another electrode mount 520 where the electrode pattern 200 is embedded deeper than a reflecting plane 522c of a cone glass 522. In the structure of the electrode mount 520, the electrode pattern 200 embedded in a bottom surface of the cone glass 522 is protected by the cone glass 522 from being brought into contact with the semiconductor wafer 100, thus effectively preventing disconnection of the electrode pattern 200. Since disconnection of the electrode pattern 200 is one of primary factors for determining a service life of the sensor head, the structure of FIG. 13 efficiently extends the service life of the sensor head. The level difference between the reflecting plane 522c of the cone glass 522 and the surface of the electrode pattern 200 can be measured with an interference microscope.

D. Process of Manufacturing Electrode Mount

Figure 14A:
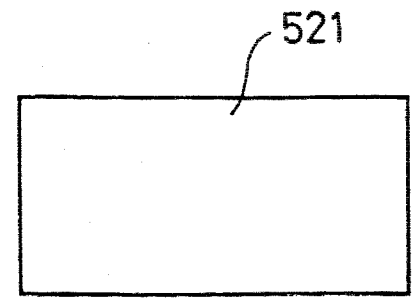
FIG. 14(a) through 14(e) are cross sectional views showing the main process steps of manufacturing a cone glass 522.

FIGS. 14(a) through 14(e) are cross sectional views showing process steps of manufacturing the cone glass 522 of FIG. 13. FIG. 14(a) shows a disk-shaped glass 521 composed of an optical glass such as BK7.

Figure 14E:
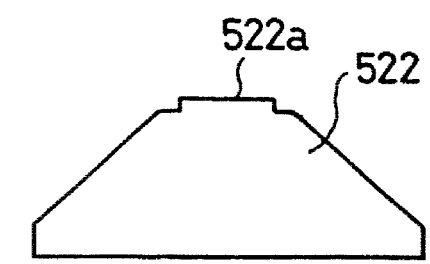
Figure 14B:
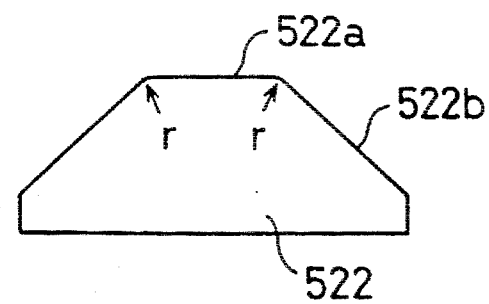

At a first step, a cone glass 522 shown in FIG. 14(b) is formed by polishing an upper portion of the disk-shaped glass 521 to be a truncated cone. The smaller flat surface 522a of the cone glass 522 is to be provided with the electrode pattern 200. Since both of the flat surfaces of the cone glass 522 are parallel to each other, the electrode pattern 200 can be easily formed on the flat surface 522a by photo lithography described below with ordinary processors for semiconductor wafers.

A circumferential edge of the flat surface 522a is rounded to make a gentle curvature extending from the flat surface 522a to an inclined face 522b, thus effectively preventing disconnection of the electrode pattern 200 during its formation. If the first surface 522a had a sharp circumferential edge or a corner edge, a resist pattern would become undesirably thick at the sharp edge, and an excessive resist might remain in a fine wiring pattern accordingly to eventually disconnect the wiring pattern. The rounded circumferential edge of the first surface 522a, on the other hand, makes no excessive resist remain at the edge, thereby preventing disconnection of the electrode pattern 200. The cone glass 66 shown in FIGS. 3(A) and 3(B) is prepared by the process of FIGS. 14(a) and 14(b).

Figure 14C:
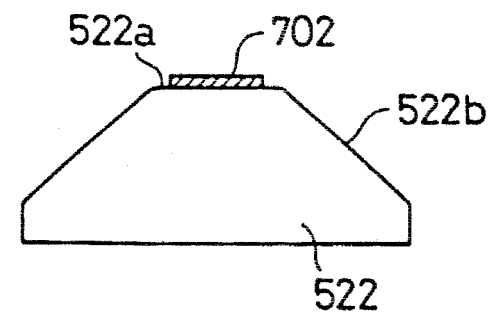

At a second step, a resist is applied on the flat surface 522a of the cone glass 522 as shown in FIG. 14(c) to form a circular resist pattern 702 having a diameter of 2.4 mm.

Figure 14D:
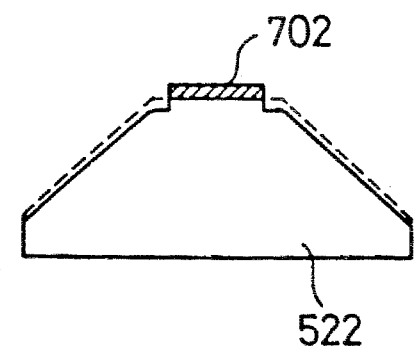

A circumference of the flat surface 522a and the inclined face 522b of the cone glass 522 are then etched by a predetermined thickness (about 2 μm in the embodiment) with an etching solution containing hydrofluoric acid. FIG. 14(d) shows the cone glass 522 thus obtained, which has a step on the circumference of the circular resist pattern 702. The step effectively reduces the parasitic capacitance of the wiring pattern as described before. FIG. 14(e) shows the cone glass 522 after removing the resist pattern 702. The cone glass 502 shown in FIG. 11 is prepared by the process steps shown in FIGS. 14(a) through 14(e). FIGS. 15(a) through 15(d) are cross sectional views showing essential process steps of forming the electrode pattern 200 on the flat surface 522a of the cone glass 522 of FIG. 14(e).

Figure 15A:
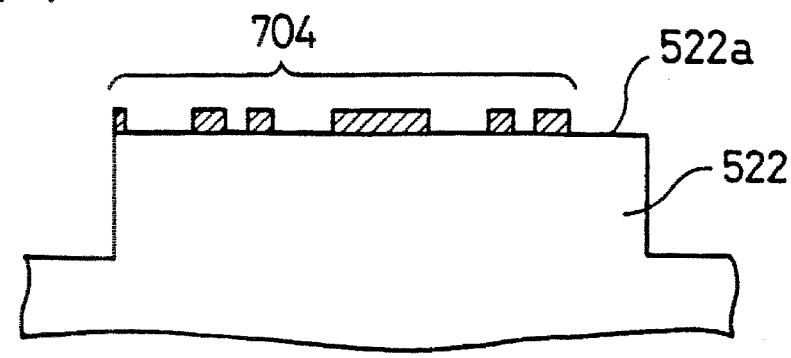
FIGS. 15(a) through 15(d) are cross sectional views showing the main process steps of forming the electrode pattern 200 on a surface of the cone glass 522.
Figure 16:
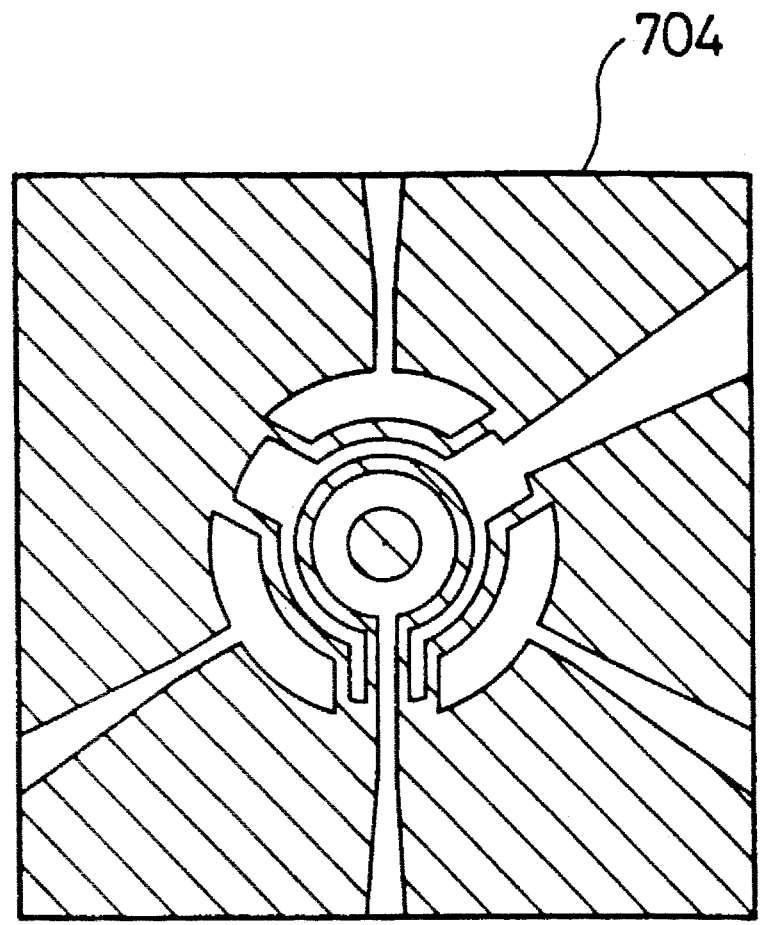
FIG. 16 is a plan view showing a resist pattern 704 used for formation of the electrode pattern 200.

At a first step shown in FIG. 15(a), a resist pattern 704 is formed on the flat surface 522a. FIG. 16 is a plan view showing the resist pattern 704, which is an inversion of the electrode pattern 200 (FIG. 3).

Figure 15B:
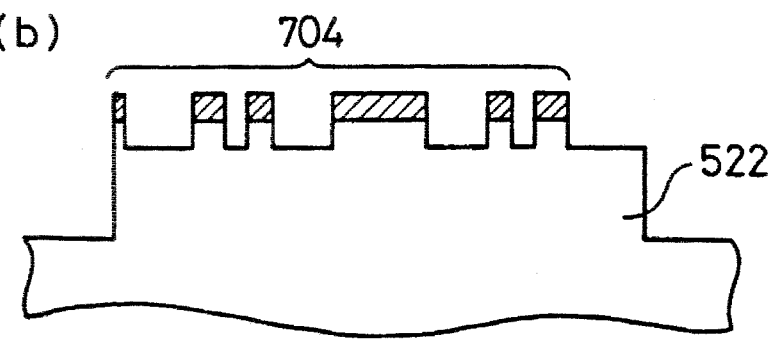

The cone glass 522 shown in FIG. 15(b) is obtained by etching the flat surface 522a covered with the resist pattern 704 to form grooves in an uncovered area, or the electrode pattern area. Each groove of the electrode pattern has a depth of about 0.1 μm.

Figure 15C:
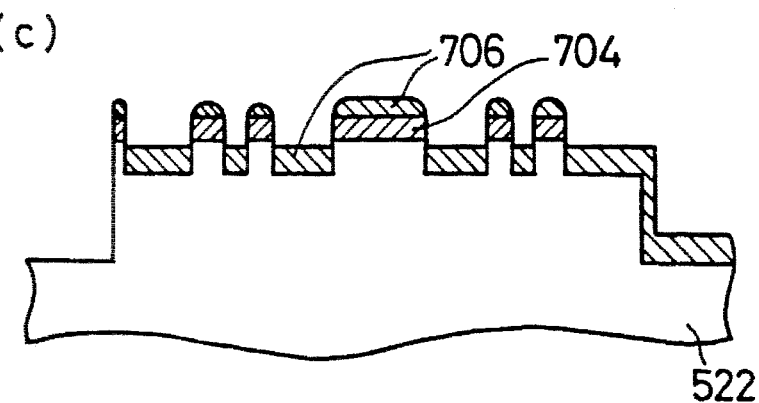
Figure 15D:
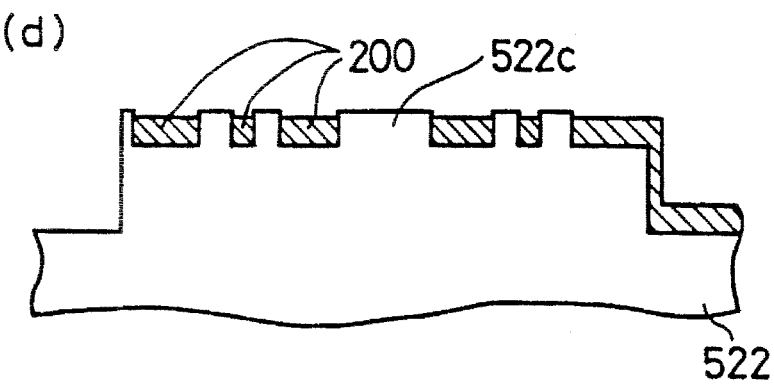

Metal 706 is then deposited on the etched surface by vapor deposition as shown in FIG. 15(c), and the resist pattern 704 and a part of the metal 706 on the resist pattern 704 are lift off to obtain the structure shown in FIG. 15(d). The metal 706 remaining in the grooves as shown in FIG. 15(d) forms the electrode pattern 200 shown in FIG. 3(A). The metal 706 is chromium (Cr) in the embodiment, but other metals such as gold and tungsten can be used as the electrode pattern material. Chromium is preferable because it is relatively cheap and hard enough not to easily cause disconnection.

If the thickness of the metal 706 is less than the depth of the grooves on the cone glass 522, the surface of the electrode pattern 200 is lower than the reflecting plane 522c of the cone glass as shown in FIG. 15(d) and FIG. 13. When the thickness of the metal 706 is equal to the depth of the grooves on the cone glass 522, on the other hand, the surface of the electrode pattern 200 is at the same level as the reflecting plane 512c as shown in FIG. 12.

As described above, the electrode pattern is easily formed by photo lithography on the cone glass having two flat surfaces parallel to each other.

E. Other Structures of Sensor Head

Figure 17A:
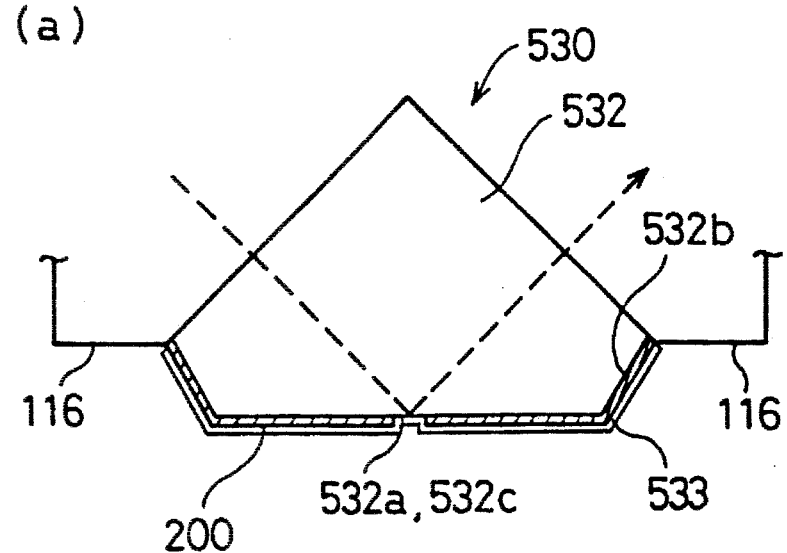
FIGS. 17(a) through 17(c) show another structure of the sensor head.
Figure 17B:
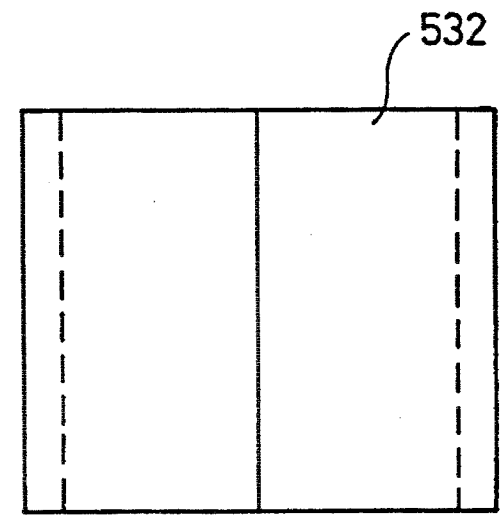

FIG. 17(a) is a cross sectional view of a sensor head 530 having another structure. The sensor head 530 includes an inclined flat faces 532b formed by cutting either edge of a rectangular prism 532. The electrode pattern 200 is formed on a flat bottom surface 532a and the inclined flat faces 532b and then covered with an insulating film 533. The electrode pattern 200 on the flat bottom surface 532a is identical with that of FIG. 3(A). The flat bottom surface 532a has a reflecting plane 532c for reflecting a laser beam. In this structure, the rectangular prism 532 has the functions of both the rectangular prism 62 and the electrode mount 64 of FIG. 4. Wirings formed on the inclined faces 532b are connected to the external lead wires 116 at an upper end of the inclined faces 532b, so that a rise of each wiring joint is not pinched between the sensor head 530 and the semiconductor wafer as is the case with the sensor head 60 using the cone glass 66 (FIG. 4). FIG. 17(b) is a plan view of the rectangular prism 532 where the wiring pattern and the lead wires are omitted for convenience of illustration.

Figure 17C:
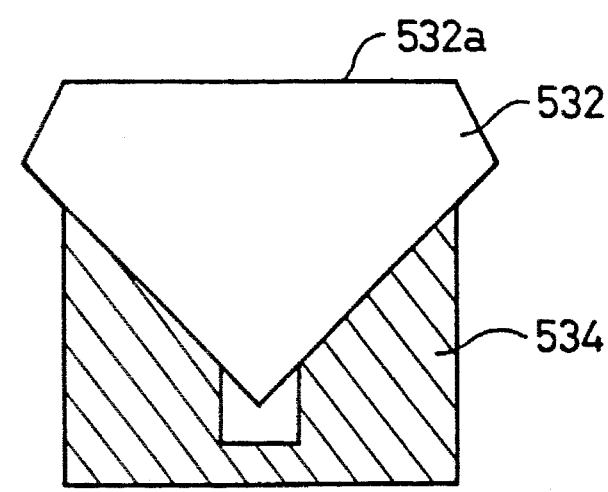

FIG. 17(c) is a cross sectional view showing the rectangular prism 532 mounted on a holder 534 in a photo lithography process. The bottom of the holder 534 is arranged parallel to the flat surface 532a of the rectangular prism 532, thereby simplifying the photo lithography process. The sensor head using the cone glass described before is, however, preferable because no such a holder is required for the photo lithography process.

Figure 18A:
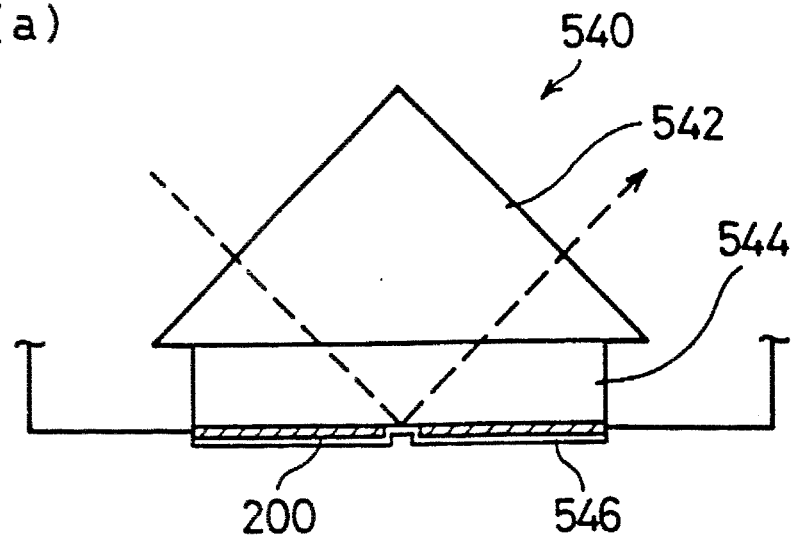
FIGS. 18(a) and 18(b) show still another structure of the sensor head.
Figure 18B:
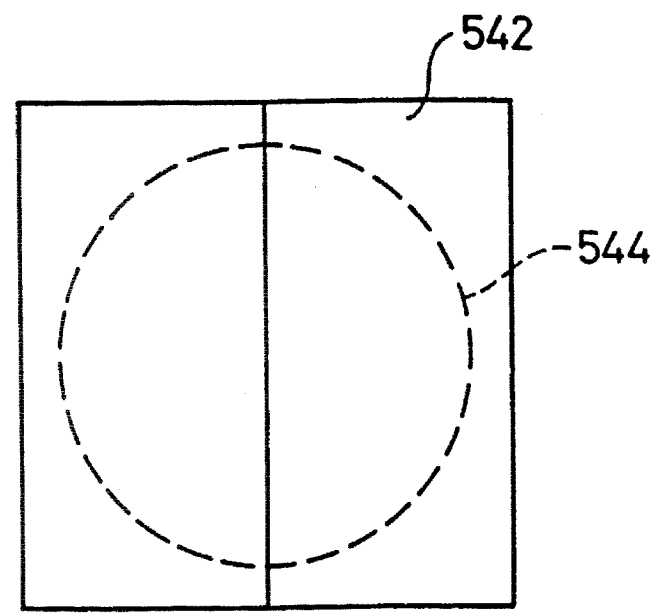

FIG. 18(a) is a cross sectional view showing a sensor head 540 having still another structure and FIG. 18(b) is a plan view of the sensor head 540. The sensor head 540 includes a rectangular prism 542 and an electrode mount 544 adhering to a bottom face of the rectangular prism 542 by an optical adhesive. The electrode pattern 200 is formed on a bottom surface of the electrode mount 544 and then covered with an insulating film 546. The electrode mount 544 is essentially composed of a disk-shaped optical glass having the electrode pattern 200 formed on the bottom surface thereof. The electrode pattern 200 is easily formed on the disk-shaped optical glass by photo lithography.

Figure 19A:
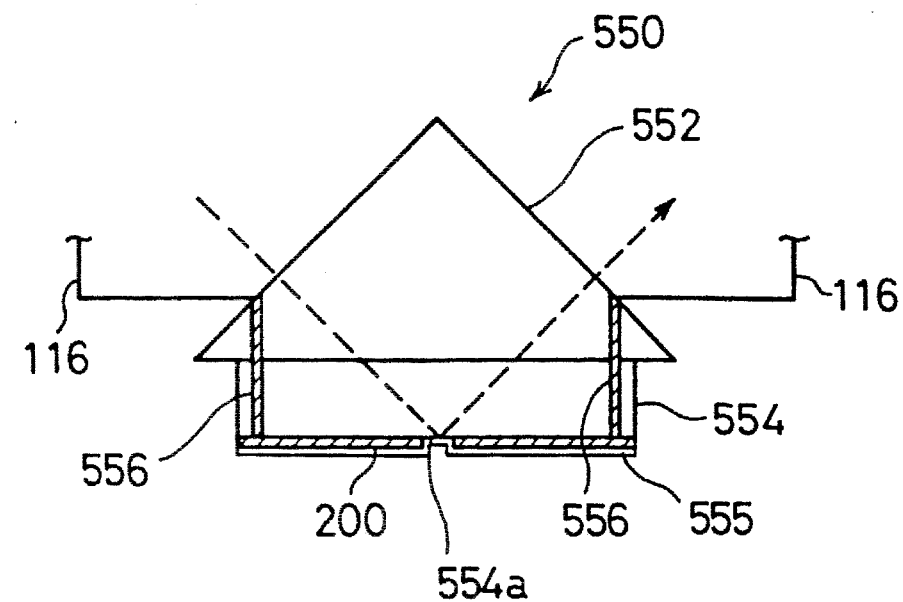
FIGS. 19(a) and 19(b) show other structures of the sensor head.

FIG. 19(a) is a cross sectional view showing a sensor head 550 having another structure. The sensor head 550 includes a rectangular prism 552 and a disk-shaped electrode mount 554 like the sensor head 540 of FIGS. 18(a) and 18(b). The electrode pattern 200 is formed on a bottom surface 554a of the electrode mount 554 and covered with an insulating film 555. The sensor head 550 of FIG. 19(a) has a plurality of through holes 556 passing through the rectangular prism 552 and the electrode mount 554. Wirings for connecting the electrode pattern 200 with the external lead wires 116 are formed in the through holes 556. Accordingly, each joint of the electrode pattern 200 with the lead wire 116 is formed near the slant surface of the rectangular prism 552 and sufficiently apart from the bottom surface 554a of the electrode mount 554, thus preventing the joint from being pinched between the bottom surface 554a and the semiconductor wafer.

Figure 19B:
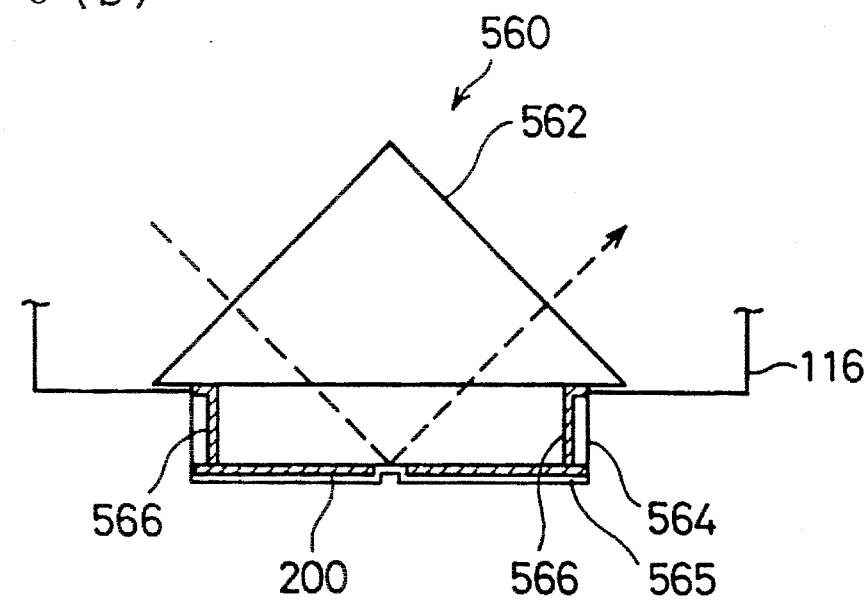

FIG. 19(b) is a cross sectional view showing another sensor head 560 having a structure similar to that of FIG. 19(a). The sensor head 560 includes a plurality of through holes 566 formed in a disk-shaped electrode mount 564 and grooves formed on a boundary between the electrode mount 564 and a rectangular prism 562 for receiving wires. The wiring for connecting the electrode pattern 200 to the external lead wires 116 runs in the through holes 566 and then passes through the grooves formed on the boundary between the electrode mount 564 and the rectangular prism 562. This structure does not require through holes formed in the rectangular prism 562 and is thereby more easily manufactured than the sensor head 540 of FIG. 19(a).

In any of the sensor heads of FIGS. 17(a) through 19(b), a step may be formed on a boundary between the electrode 201 and the wiring 201a as shown in FIG. 11. Further, the electrode pattern 200 may be embedded in the bottom face of the sensor head as shown in FIGS. 12 and 13.

Although a rectangular prism is used for introducing a laser beam into the electrode mount in each of the sensor heads described above, it can be replaced with another prism having a prism angle other than 90 degrees, or another optical element like optical fibers.

A transparent material having a truncated pyramid shape can be used in place of the truncated cone-shaped cone glass of the above embodiment. In general, a transparent member having two flat surfaces parallel to each other and can inclined side face makes a sensor head on which an electrode pattern can be easily formed by photo lithography and readily connected with external lead wires.

Figure 20A:
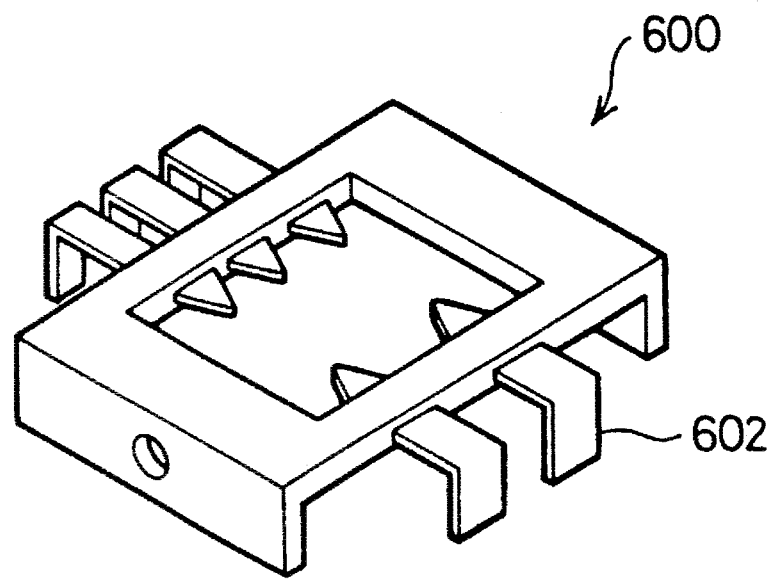
FIGS. 20(a) and 20(b) show a connector 600 for electrically connecting the sensor head.
Figure 20B:
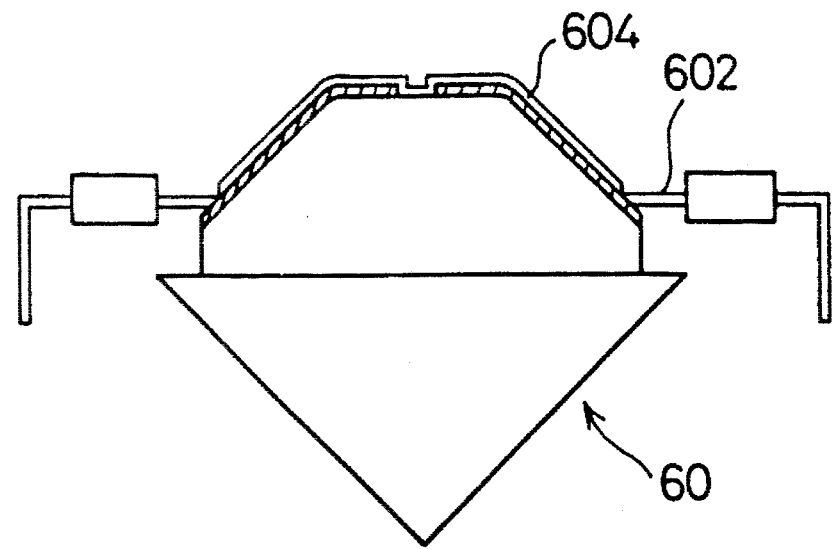

In one application, a connector 600 having a plurality of metal pawls 602 as shown in FIG. 20(a) can be used in place of the external lead wires. The metal pawls 602 are mechanically brought into contact with the wiring of the electrode mount. FIG. 20(b) is a cross sectional view showing the sensor head 60 fixed to the connector 600. Since each joint on the cone glass is sufficiently apart from a reflecting plane for reflecting a laser beam, the sensor head 60 can be fixed mechanically to the pawls 602. In electrical connection with the pawls 602, an insulating film 604 is formed not to cover the joints.

The present invention is not limited to the sensor head for the C—V curve measuring apparatus, but it can be also applicable to any sensor heads for the non-destructive measuring apparatus for measuring the electrical characteristics of a semiconductor wafer, in which the test electrode and the semiconductor wafer is separated during the measurement.

Figure 1A:
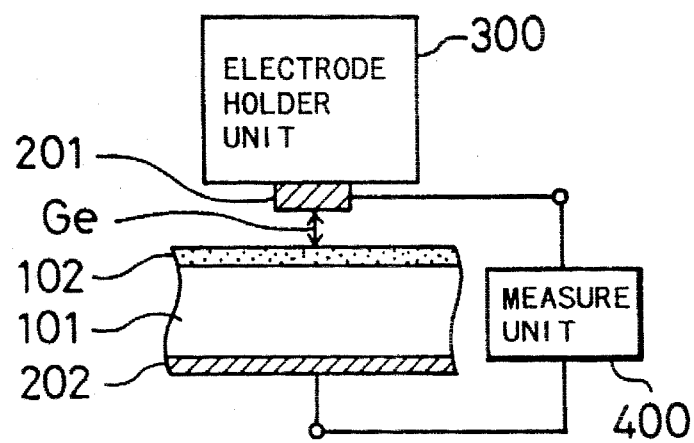
FIGS. 1(a) through 1(c) show principles of a non-destructive measuring apparatus for semiconductors.
Figure 1B:
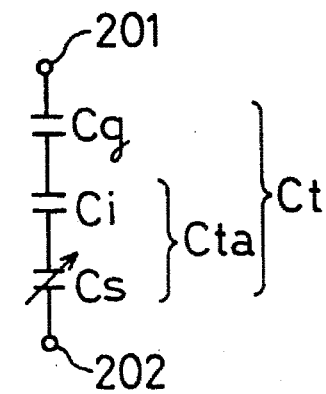
Figure 1C:
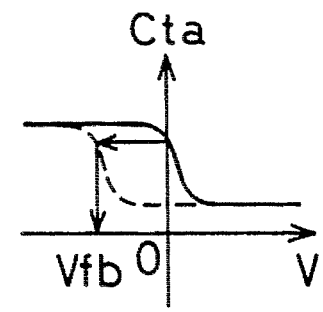

The electrical characteristics other than the C—V curve include a C—t curve, which is a time dependency of the composite capacitance Cta (FIG. 1(b)) measured by the Zerbst method, to be used to evaluate the transient characteristics of the semiconductor in the vicinity of the semiconductor surface. Measurement of the conductance with the impedance meter 24 allows evaluation of the interface trapped charge at the interface between the semiconductor substrate 101 and the oxide film 102. By performing the C—V curve measurement for semiconductor wafers without an oxide film among a variety of processes including cleaning of the semiconductor substrate, thermal oxidation, and heat treatment for stabilizing the oxide film, quality of each process can be evaluated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sensor for use in non-destructive measurement of electrical characteristics of a semiconductor wafer, comprising:

a transparent member having a first flat surface and a second flat surface substantially parallel with each other, said first flat surface adapted to be spaced substantially parallel from a surface of the semiconductor wafer, said first flat surface having a reflecting plane to reflect a light beam introduced into said transparent member under geometric optical total reflection conditions, said geometric optical total reflection conditions being defined by a non-perpendicular incident angle of said light beam on said reflecting plane and a refractive index of said transparent member, said geometric optical total reflection conditions allowing a part of said light beam incident on said reflecting plane to pass through said reflecting plane by a tunnel effect when said reflecting plane and a surface of said semiconductor wafer are sufficiently close to each other to cause said tunnel effect, said reflected light beam reflected by said reflecting plane being measured to determine a gap between said reflecting plane and said surface of said semiconductor wafer spaced from said reflecting plane;

a test electrode formed on said first flat surface; and an insulating film of a predetermined thickness formed at least on said test electrode so that said insulating film enhances electrical breakdown characteristics of said test electrode, said predetermined thickness allowing said part of said light beam incident on said reflecting plane under said geometric optical reflection conditions to pass through said insulating film.

2. A sensor in accordance with claim 1, further comprising:

light introducing means for introducing the light beam into said transparent member to be reflected by said reflecting plane.

3. A sensor in accordance with claim 2, wherein said light introducing means comprises a prism attached to said second flat surface of said transparent member.

4. A sensor in accordance with claim 1, wherein said transparent member includes a sloping part having an inclined side face extending from said first flat surface.

5. A sensor in accordance with claim 4, wherein said sloping part has a shape of a truncated cone having said first flat surface and said inclined side face.

6. A sensor in accordance with claim 5, wherein said first flat surface of said transparent member includes a step part at the circumference thereof and a central part inside said step part, whereby said step part is to be spaced farther from said semiconductor wafer than said central part.

7. A sensor in accordance with claim 4, further comprising:

a wire attached on said inclined face of said sloping part and connected to said test electrode; and conductive means electrically connected with said wire on said inclined side face.

8. A sensor in accordance with claim 1, wherein said test electrode includes a ring-shaped part surrounding said reflecting plane.

9. A sensor in accordance with claim 8, further comprising a plurality of first conductive layers each being formed on said first flat surface of said transparent member, said plurality of first conductive layers having an identical shape with each other placed symmetrically about said ring-shaped part of said test electrode and being separated to be insulated from said test electrode.

10. A sensor in accordance with claim 9, further comprising a second conductive layer formed on said first flat surface of said transparent member among said ring-shaped part of said test electrode and said plurality of first conductive layers, said second conductive layer being separated to be insulated from said ring-shaped part of said test electrode and said plurality of first conductive layers.

11. A sensor in accordance with claim 1, wherein said test electrode is embedded in said first flat surface such that a surface of said test electrode is level with said first flat surface.

12. A sensor in accordance with claim 1, wherein said test electrode is embedded in said first flat surface such that a surface of said test electrode is to be spaced farther from said semiconductor wafer than said first flat surface.

\* \* \* \* \*